(12) United States Patent
Park et al.

(10) Patent No.: US 10,403,689 B2
(45) Date of Patent: Sep. 3, 2019

(54) DISPLAY DEVICE

(71) Applicant: Samsung Display Co., Ltd., Yongin-si, Gyeonggi-do (KR)

(72) Inventors: Yong Sung Park, Seoul (KR); Min Woo Byun, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/985,545

(22) Filed: May 21, 2018

(65) Prior Publication Data

US 2019/0115400 A1 Apr. 18, 2019

(30) Foreign Application Priority Data

Oct. 12, 2017 (KR) ........................ 10-2017-0132797

(51) Int. Cl.
| | |
|---|---|
| *H01L 27/32* | (2006.01) |
| *G09G 3/3258* | (2016.01) |
| *H01L 51/52* | (2006.01) |
| *G09G 3/3266* | (2016.01) |
| *G09G 3/3275* | (2016.01) |
| *H01L 51/50* | (2006.01) |

(52) U.S. Cl.
CPC ....... *H01L 27/3223* (2013.01); *G09G 3/3258* (2013.01); *G09G 3/3266* (2013.01); *G09G 3/3275* (2013.01); *H01L 27/3276* (2013.01); *H01L 51/5012* (2013.01); *H01L 51/5206* (2013.01); *H01L 51/5221* (2013.01); *G02F 2201/121* (2013.01); *G02F 2201/123* (2013.01)

(58) Field of Classification Search
CPC ............. H01L 27/3223; H01L 51/5012; H01L 51/5221; H01L 51/5206; H01L 27/3276; G09G 3/3275; G09G 3/3266; G09G 3/3258; G02F 2201/121; G02F 2201/123
See application file for complete search history.

(56) References Cited

U.S. PATENT DOCUMENTS

| 2014/0139413 A1* | 5/2014 | Kwon ................... G09G 3/3208 345/82 |
| 2015/0091013 A1* | 4/2015 | Bae ..................... H01L 27/3276 257/72 |
| 2018/0315952 A1* | 11/2018 | Kim ..................... H01L 27/3244 |

FOREIGN PATENT DOCUMENTS

| KR | 10-2006-0004255 A | 1/2006 |
| KR | 10-2006-0071518 A | 6/2006 |
| KR | 10-2009-0045536 A | 5/2009 |
| KR | 20-2017-0001649 U | 5/2017 |

* cited by examiner

*Primary Examiner* — Abhishek Sarma
(74) *Attorney, Agent, or Firm* — Lewis Roca Rothgerber Christie LLP

(57) ABSTRACT

A display device includes: a display panel including a display area and a non-display area adjacent to the display area; a gate driver disposed in the non-display area; and an emission driver disposed in the non-display area. The display panel includes a pad portion to which signals are input, and the pad portion includes a pad group including pads to which signals transmitted to the gate driver and the emission driver are input. In the pad group, a distance between an emission frame signal input pad and a pad adjacent to the emission frame signal input pad is greater than a distance between a scan frame signal input pad and a pad adjacent to scan frame signal input pad.

20 Claims, 14 Drawing Sheets

DISPLAY DEVICE

CROSS-REFERENCE TO RELATED APPLICATION

This application claims priority to and the benefit of Korean Patent Application No. 10-2017-0132797, filed in the Korean Intellectual Property Office on Oct. 12, 2017, the entire content of which is incorporated herein by reference.

BACKGROUND

1. Field

This disclosure relates to a display device.

2. Description of the Related Art

Display devices such as an organic light emitting device or a liquid crystal display are currently used. The display device includes a display panel including pixels for displaying images. Circuits and pads (for inputting signals for controlling the pixels and the circuits) are formed in addition to the pixels on the display panel, and signal lines (connected to the pads to transmit signals) are also formed thereon.

To satisfy the high resolution trend (e.g., requirement) of the display device, the number of signals transmitted to the display panel is being increased, and the number of pads for transmitting the signals is also being increased. To increase the number of pads in the limited pad region (i.e., a pad portion), the pad pitch is being reduced, and in this case, reliability may be deteriorated.

The above information disclosed in this Background section is only for enhancement of understanding of the background of the invention and therefore it may contain information that does not form prior art.

SUMMARY

An aspect according to embodiments is directed toward a display device with an improved pad portion.

According to an exemplary embodiment, a display device includes: a display panel including a display area and a non-display area adjacent to the display area; a gate driver in the non-display area; and an emission driver in the non-display area. The display panel includes a pad portion to which signals are input, and the pad portion includes a pad group to which signals transmitted to the gate driver and the emission driver are input, the pad group including an emission frame signal input pad, a pad adjacent to the emission frame signal input pad, a scan frame signal input pad and a pad adjacent to the scan frame signal input pad. A distance between the emission frame signal input pad and the pad adjacent to emission frame signal input pad is greater than a distance between the scan frame signal input pad and the pad adjacent to the scan frame signal input pad.

A first emission clock signal or a clock signal may be input to the pad adjacent to the emission frame signal input pad.

The pad adjacent to the emission frame signal input pad includes a first emission clock signal input pad and a clock signal input pad, the emission frame signal input pad between the first emission clock signal input pad and the clock signal input pad. The first emission clock signal may be input to the first emission clock signal input pad, and the clock signal may be input to the clock signal input pad.

The pad adjacent to the scan frame signal input pad may be a dummy pad.

The pad group may further include a second emission clock signal input pad adjacent to the first emission clock signal input pad, the first emission clock signal input pad between the second emission clock signal input pad and the emission frame signal input pad. A distance between the first emission clock signal input pad and the second emission clock signal input pad may be greater than a distance between the scan frame signal input pad and the pad adjacent to the scan frame signal input pad.

A second emission clock signal with a phase that is opposite to a phase of the first emission clock signal may be input to the second emission clock signal input pad.

The pad adjacent to the emission frame signal input pad may include a first pad adjacent to the emission frame signal input pad and a second pad adjacent to the emission frame signal input pad, the emission frame signal input pad between the first pad and the second pad. A distance between the emission frame signal input pad and the first pad may correspond to a summation of twice the distance between the scan frame signal input pad and the pad adjacent to the scan frame signal input and a width of the emission frame signal input pad.

A distance between the second emission clock signal input pad and the first emission clock signal input pad may correspond to a summation of twice the distance between the scan frame signal input pad and the pad adjacent to the scan frame signal input pad and a width of the emission frame signal input pad.

A width of the scan frame signal input pad may correspond to a width of the emission frame signal input pad.

According to another embodiment, a display device includes: a display panel including a display area and a non-display area adjacent to the display area; a gate driver in the non-display area; and an emission driver in the non-display area. The display panel includes a pad portion to which signals are input, and the pad portion includes a pad group to which signals transmitted to the gate driver and the emission driver are input, the pad group including an emission frame signal input pad and a pad adjacent to the emission frame signal input pad. A width of the pad adjacent to the emission frame signal input pad is less than a width of the emission frame signal input pad.

The pad adjacent to the emission frame signal input pad may be a dummy pad.

The pad adjacent to the emission frame signal input pad includes a first pad adjacent to the emission frame signal input pad and a second pad adjacent to the emission frame signal input pad, the emission frame signal input pad between the first pad and the second pad. A width of the first pad and a width of the second pad may each be less than a width of the emission frame signal input pad.

The first pad and the second pad may be dummy pads.

The pad group may further include a first emission clock signal input pad adjacent to the first pad and a clock signal input pad adjacent to the second pad, the first pad between the first emission clock signal input pad and the emission frame signal input pad, and the second pad between the clock signal input pad and the emission frame signal input pad. An emission clock signal may be input to the first emission clock signal input pad, and a clock signal may be input to the clock signal input pad.

The pad group may further include a third pad adjacent to the first emission clock signal input pad, the first emission clock signal input pad between the third pad and the first pad. A width of the third pad may be less than a width of the emission frame signal input pad.

The third pad may be a dummy pad.

The pad group may further include a second emission clock signal input pad adjacent to the third pad, the third pad between the second emission clock signal input pad and the first emission clock signal input pad. A second emission clock signal with a phase that is opposite to a phase of the first emission clock signal is input to the second emission clock signal input pad.

The pad group may further include a clock signal input pad adjacent to the second pad, the second pad between the clock signal input pad and the emission frame signal input pad. A clock signal may be input to the clock signal input pad.

The pad group may further include a scan frame signal input pad and a pad adjacent to the scan frame signal input pad. A distance between the emission frame signal input pad and the pad adjacent to the emission frame signal input pad may be greater than a distance between the scan frame signal input pad and the pad adjacent to the scan frame signal input pad.

According to the exemplary embodiments, even though a voltage difference among signals input to the adjacent pads is maintained for a long period of time, generation of short circuits among pads or corrosion of pads may be prevented or reduced, and reliability of the signals transmitted through the pads may be improved.

DETAILED DESCRIPTION

Figure 1:
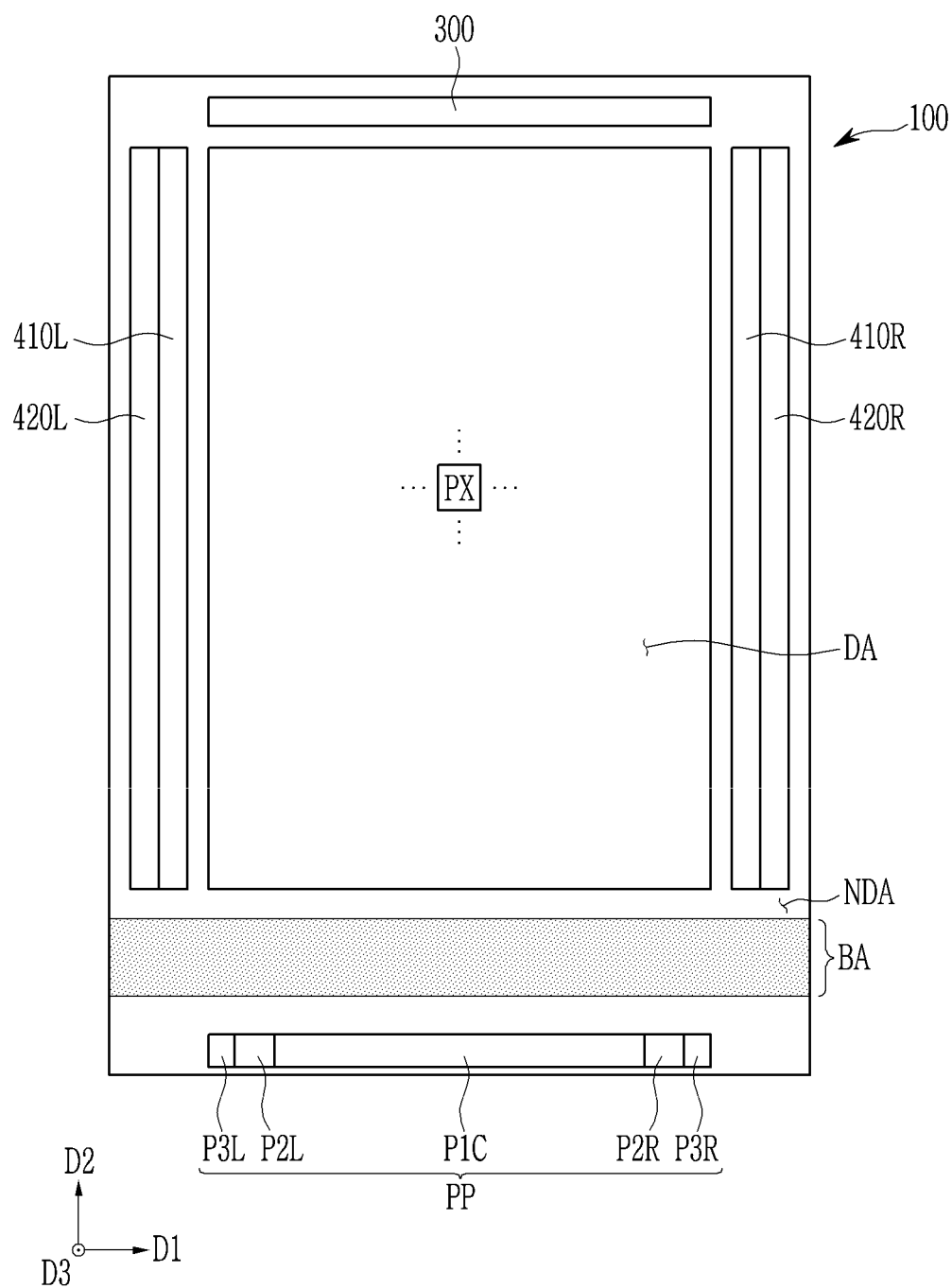
FIG. 1 shows a layout view of a display panel according to an exemplary embodiment.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

The size and thickness of each configuration shown in the drawings are arbitrarily shown for better understanding and ease of description, and the present invention is not limited thereto. In the drawings, the thickness of layers, films, panels, regions, etc., are exaggerated for clarity. For better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

The phrase "on a plane" refers to viewing the object portion from the top, and the phrase "on a cross-section" refers to viewing a cross-section of which the object portion is vertically cut from the side.

A display device according to an exemplary embodiment of the present invention will now be described in more detail with reference to the accompanying drawings. An organic light emitting device will be exemplified as the display device, and the present invention is not limited to the organic light emitting device.

FIG. 1 shows a layout view of a display panel according to an exemplary embodiment.

Referring to FIG. 1, the display device includes a display panel 100. The display panel 100 includes a display area (DA) for displaying images, and a non-display area (NDA) in which circuits and/or signal lines for generating and/or transmitting various signals applied to the display area (DA) are disposed and which is provided near the display area (DA).

The pixels PX are, for example, disposed in a matrix in the display area (DA) of the display panel 100. Signal lines such as scan lines (also referred to as gate lines), emission control lines, data lines, or driving voltage lines are also disposed in the display area (DA). The scan lines and the emission control lines may mainly extend in a first direction D1 (e.g., a row direction), and the data lines and the driving voltage lines may extend in a second direction D2 (e.g., a column direction) crossing the first direction D1. Each of the pixels PX may be connected to the scan line, the emission control line, the data line, and the driving voltage line so that each of the pixels PX may receive a scan signal (also referred to as a gate signal), an emission control signal, a data voltage, and a driving voltage (ELVDD) from the signal lines.

A pad portion (PP) in which pads for receiving signals from outside of the display panel 100 are formed is provided in the non-display area (NDA) of the display panel 100. Electronic components such as a flexible printed circuit film may be bonded to the pad portion (PP), and pads or bumps of the flexible printed circuit film may be electrically connected to the pads of the pad portion (PP).

The non-display area (NDA) of the display panel 100 of the display device includes a driving unit for generating and/or processing various signals for driving the display panel 100. The driving unit includes a data driver for applying a data signal to the data lines, scan drivers 410L and 410R for applying scan signals to the scan lines, emission drivers 420L and 420R for applying emission control signals to the emission control lines, and a signal controller for controlling the data driver, the scan drivers 410L and 410R, and the emission drivers 420L and 420R.

The scan drivers 410L and 410R and the emission drivers 420L and 420R are integrated in the display panel 100. The scan drivers 410L and 410R may include a scan driver 410L and a scan driver 410R provided on a left side and a right side of the display area (DA), respectively. The emission drivers 420L and 420R may include an emission driver 420L and an emission driver 420R provided on the left side and the right side of the display area (DA), respectively. The scan drivers 410L and 410R may be provided nearer (i.e., closer to) the display area (DA) than the emission drivers 420L and 420R, or vice versa. Differing from the shown exemplary embodiment, the scan driver and/or the emission driver may be provided on one of the left side and the right side of the display area (DA), and the same may be provided on an upper side or a lower side of the display area (DA).

The data driver and the signal controller may be provided as a driving circuit chip. The driving circuit chip may be electrically connected to the display panel 100 as a tape carrier package (TCP), or it may be mounted on the display panel 100 as an integrated circuit chip. The data driver and the signal controller may be formed to be a single chip or they may be formed to be individual chips.

A turn-on circuit portion 300 may be provided in the non-display area (NDA) of the display panel 100. The turn-on circuit portion 300 may be, for example, provided on the upper side of the display area (DA). The turn-on circuit portion 300 may include transistors and may test whether the display panel 100 is cracked.

The display panel 100 may include a bending area (BA). The bending area (BA) may, for example, be provided in the non-display area (NDA) between the display area (DA) and the pad portion (PP). The bending area (BA) is provided to traverse the display panel 100 in the first direction D1. The display panel 100 is bent in the bending area (BA), so the pad portion (PP) provided further distant from the display area (DA) than the bending area (BA) may be provided on a rear side of the display area (DA).

A pad portion (PP) in which pads corresponding to an input access terminal for receiving signals from the outside of the display panel 100 are arranged is provided in the non-display area (NDA) of the display panel 100. The pad portion (PP) includes a first pad group (P1C), a second pad group (P2L, P2R), and a third pad group (P3L, P3R) according to the input signals (e.g., types of input signals).

The pads provided in the first pad group (P1C) receive data signals applied to the data lines of the display area (DA). The first pad group (P1C) may be referred to as a data signal input pad group. The first pad group (P1C) may be provided in the center of the pad portion (PP) and may occupy the widest area.

In the second pad group (P2L, P2R), pads are arranged in one column substantially in the first direction D1, and the pads may be arranged in a plurality of columns. The pads provided in the second pad group (P2L, P2R) receive signals (to be described later) for built-in driving circuits such as the scan drivers 410L and 410R, the emission drivers 420L and 420R, and the turn-on circuit portion 300 provided in the non-display area (NDA) of the display panel 100. The second pad group (P2L, P2R) may be referred to as a built-in circuit driving signal input pad group. The second pad group (P2L, P2R) may include a second pad group (P2L) and a second pad group (P2R) provided on the left side and the right side of the first pad group (P1C), and the second pad group (P2L) and the second pad group (P2R) may be symmetric with the first pad group (P1C).

The pads provided in the third pad group (P3L, P3R) receive a driving voltage (ELVDD) applied to driving voltage lines of the display area (DA) and a common voltage (ELVSS) applied to a common electrode of the pixels PX. The third pad group (P3L, P3R) may be referred to as a power voltage input pad group. The third pad group (P3L, P3R) may include a third pad group (P3L) and a third pad group (P3R) provided on the left side and the right side of the first pad group (P1C), respectively, and the third pad group (P3L) and the third pad group (P3R) may be symmetric with the first pad group (P1C).

The third pad group (P3L, P3R) may be provided to be further distant from the first pad group (P1C) than the second pad group (P2L, P2R) is, or the third pad group (P3L, P3R) may be provided to be nearer (i.e., closer to) the first pad group (P1C) than the second pad group (P2L, P2R) is. The second pad group and/or the third pad group may be provided on one of the left side and the right side of the first pad group (P1C).

The whole configuration of the display panel 100 has been described. The second pad group (P2L, P2R) in which the pads for receiving driving signals transmitted to the built-in circuit of the display panel 100 will now be described in more detail with reference to FIG. 2 and FIG. 3.

Figure 2:
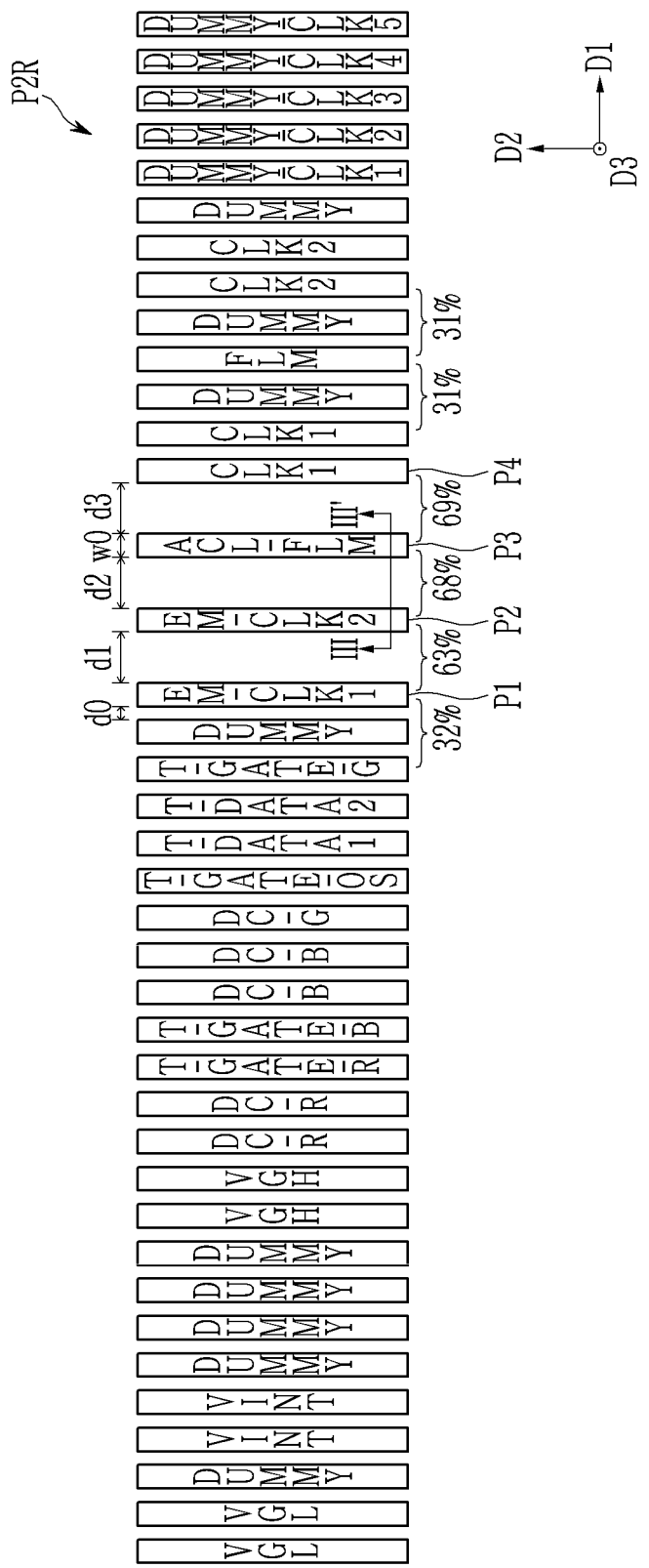
FIG. 2 shows an enlarged view of part of a pad portion of FIG. 1 according to an exemplary embodiment.
Figure 3:
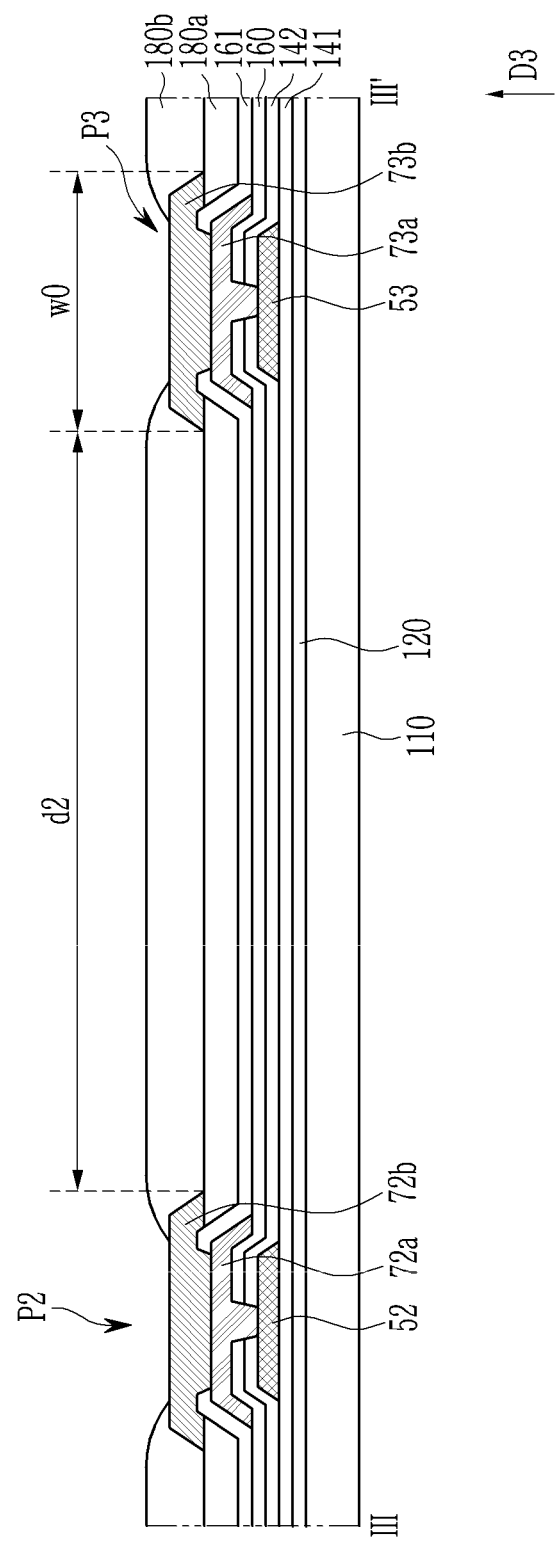
FIG. 3 shows a cross-sectional view taken along the line III-III' of FIG. 2.

FIG. 2 shows an enlarged view of part of a pad portion of FIG. 1 according to an exemplary embodiment, and FIG. 3 shows a cross-sectional view taken along the line III-III' of FIG. 2. Without specific mention, the previously-described drawings will also be referred to if needed.

Referring to FIG. 2, a second pad group (P2R) is provided on the right side of the first pad group (P1C) shown in FIG. 1. The second pad group (P2L) provided on the left side of the first pad group (P1C) may be symmetric with (e.g., may have substantially the same structure as) the second pad group (P2R), so the description on the second pad group (P2R) may be applied to the second pad group (P2L). Therefore, the description of the second pad group (P2L) will be substituted by (e.g., may be substantially the same as) the description of the second pad group (P2R).

The second pad group (P2R) includes pads arranged in the first direction D1. The pads shown as rectangles may be arranged in parallel to each other and may have substantially the same size. The pads may be substantially rectangles or parallelograms, and their long sides may be substantially parallel to the second direction D2, while the long sides may be somewhat inclined with respect to the second direction D2. The pads may have substantially the same width w0. With an exception of some pads (P1, P2, P3, P4) to which reference numerals are written (e.g., provided), distances d0 between adjacent pads may be substantially the same as each other, and pitches of the pads may be constant (i.e., the same).

The second pad group (P2R) includes pads for receiving signals (hereinafter, signal pads), and pads that are not for receiving signals (hereinafter, dummy pads). In the drawing, the signal pads respectively have a received signal written thereon, and the dummy pads respectively have DUMMY written thereon.

Regarding the received signals, a gate low voltage (VGL) may be transmitted to the scan drivers (410L and 410R) and the emission drivers (420L and 420R), and may be utilized to generate low voltage levels of the scan signal and the emission control signal. The initialization voltage (VINT) is utilized to drive the pixel PX. The gate low voltage (VGL)

and the initialization voltage (VINT) are negative polarity (−) signals with a voltage level that is less than a reference voltage such as a ground voltage.

The gate high voltage (VGH) may be transmitted to the scan drivers (410L and 410R) and the emission drivers (420L and 420R), and may be utilized to generate high voltage levels of the scan signal and the emission control signal. RGB constant voltages (DC_R, DC_G, and DC_B) may be transmitted to the turn-on circuit portion 300, and may be utilized to check whether the display panel 100 is cracked or not. Test signals (T_GATE_R, T_GATE_B, T_GATE_G, T_GATE_OS, T_DATA1, T_DATA2) may be utilized to test the pixels PX. The gate high voltage (VGH), the RGB constant voltages (DC_R, DC_G, DC_B), and the test signals (T_GATE_R, T_GATE_B, T_GATE_G, T_GATE_OS, T_DATA1, T_DATA2) are positive polarity (+) signals with voltage levels that are greater than the reference voltage.

Emission clock signals (EM_CLK1, EM_CLK2) are transmitted to the emission drivers (420L and 420R) and are utilized to generate emission control signals. The emission clock signals (EM_CLK1, EM_CLK2) include a first emission clock signal (EM_CKL1) and a second emission clock signal (EM_CLK2) that may have opposite phases. An emission frame signal (ACL_FLM) is transmitted to the emission drivers 420L and 420R, and instructs the start of one frame for inputting the emission control signal to the display area (DA). The emission frame signal (ACL_FLM) may be referred to as an emission start pulse signal. Scan clock signals CLK1 and CLK2 are transmitted to the scan drivers 410L and 410R and are utilized to generate a scan signal. The scan clock signals CLK1 and CLK2 include a first scan clock signal CLK1 and a second scan clock signal CLK2 that may have opposite phases. The scan frame signal (FLM) is transmitted to the scan drivers 410L and 410R, and instructs the start of one frame for inputting a scan signal to the display area (DA). The scan frame signal (FLM) may be referred to as a scan start pulse signal. The emission clock signals (EM_CLK1, EM_CLK2), the emission frame signal (ACL_FLM), the scan clock signals CLK1 and CLK2, and the scan frame signal (FLM) are signals that respectively do not have a constant polarity with respect to time, and they represent signals the voltage of each of which swings between the positive polarity (+) and the negative polarity (−). The emission clock signals (EM_CLK1, EM_CLK2), the emission frame signal (ACL_FLM), the scan clock signals (CLK1 and CLK2), and the scan frame signal (FLM) may swing between a first voltage that is a high voltage with the positive polarity (+) and a second voltage that is a low voltage with the negative polarity (−).

Referring to FIG. 2, signal pads for receiving signals with the negative polarity (−), signal pads for receiving signals with the positive polarity (+), and signal pads for receiving signals that swing (between the positive polarity (+) and the negative polarity (−)) are sequentially arranged. Further, a dummy pad is provided between the signal pads to which signals with different polarities are input and the signal pads to which signals that swing (in polarity) are input, to thus increase the distance therebetween. When the voltage difference between the adjacent signal pads is large, a strong electric field is generated between them so that charges may move (e.g., between adjacent pads) and corrosion may easily occur. The corrosion may cause an increase of resistance, a disconnection, a short circuit, or a bonding defect, so it may deteriorate reliability of the display device. When the signal pads are grouped and arranged according to the polarities of the applied signals as described above, the voltage difference between adjacent signal pads may be reduced, which may help prevent or substantially prevent the pads from being corroded.

The disposal of dummy pads between the signal pads with a great voltage difference increases the distance between the signal pads, so it is effective in reducing the intensity of the electric field. However, when the voltage difference between the signal pads is maintained for a long time, the pads may be short-circuited when dummy pads are provided, which may cause a defect such as generation of horizontal lines in the display area (DA). For example, metal particles such as particles of silver (Ag) that may remain in the second pad group (P2R) may migrate toward the dummy pad by the electric field and the dummy pad may function as a short path (i.e., a short circuit between signal pads caused by a short circuit by the signal pads and the dummy pad). In particular, this problem may be easily generated among a signal pad P1 (hereinafter, a first pad) to which the first emission clock signal (EM_CLK1) is input, a signal pad P2 (hereinafter, a second pad) to which the second emission clock signal (EM_CLK2) is input, a signal pad P3 (hereinafter, a third pad) to which the emission frame signal (ACL_FLM) is input, and a signal pad P4 (hereinafter, a fourth pad) to which the first scan clock signal CLK1 is input.

According to one design standard, the emission clock signals (EM_CLK1, EM_CLK2), the emission frame signal (ACL_FLM), and the scan clock signal CLK1 may swing between the first voltage with the positive polarity (+) of about 7 volts and the second voltage with the negative polarity (−) of about −9 volts. In this case, a difference (hereinafter, a voltage difference) between the first voltage and the second voltage is about 16 volts. Because of waveforms and timing of the respective signals, a voltage difference may be generated for 63% of one frame between the first pad P1 and the second pad P2, a voltage difference may be generated for 68% of one frame between the second pad P2 and the third pad P3, and a voltage difference may be generated for 69% of one frame between the third pad P3 and the fourth pad P4.

A large voltage difference lasts for a relatively long time among the adjacent pads (P1, P2; P2, P3; P3, P4), so the dummy pad between the pads may function as a short path. Therefore, according to an exemplary embodiment, the dummy pad may not be disposed between the first pad P1 and the second pad P2, and the distance d1 between the first pad P1 and the second pad P2 may become as wide as the dummy pad. In a like manner, the dummy pad may not be disposed between the second pad P2 and the third pad P3, and the distance d2 between the second pad P2 and the third pad P3 may become as wide as the dummy pad. Further, the dummy pad may not be disposed between the third pad P3 and the fourth pad P4, and the distance d3 between the third pad P3 and the fourth pad P4 may become as wide as the dummy pad. Therefore, the distance d1 between the first pad P1 and the second pad P2, the distance d2 between the second pad P2 and the third pad P3, and the distance d3 between the third pad P3 and the fourth pad P4 may be equal to the summation of twice the distance d0 between other pads and the width w0 of one pad (d1=d2=d3=2d0+w0).

A voltage difference of about 18 volts may be generated between the signal pad for receiving the first scan clock signal CLK1 and the signal pad for receiving the scan frame signal (FLM) and between the signal pad for receiving the scan frame signal (FLM) and the signal pad for receiving the second scan clock signal CLK2, and a period thereof is 31% of one frame so it is relatively short. Therefore, when the dummy pad is disposed between these signal pads as shown in FIG. 2, the dummy pad may not function as a short path. A large voltage difference may be generated between the signal pad for receiving a test gate signal (T_GATE_G) that is a voltage with a positive polarity (+) and the first pad P1 for receiving the swinging first emission clock signal (EM_CLK1), and its period is about 32% of one frame, which is relatively short. Therefore, when the dummy pad is disposed between these signal pads to increase the distance, generation of a short circuit caused by the dummy pad may not be problematic (e.g., may not happen).

According to the design of the display device, signals may be input to the pads of the second pad group (P2R) in an order that is different from the above-noted order. In this case, the dummy pad is not disposed between the signal pads that maintain the voltage difference for a long time (e.g., greater than about 60% of one frame), and the signal pads may be disposed with the distance (2d0+w0) that is wider than the width of the dummy pad. The second pad group (P2R) may include pads that are greater or lesser than the above-described pads in number. The second pad group (P2R) may receive signals that are different from the above-noted signals, and it may not receive at least one of the above-described signals.

Referring to FIG. 3, cross-sectional structures of the second pad P2, the third pad P3, and a region therebetween are shown. The second pad P2 and the third pad P3 are shown, and other pads of the pad portion (PP) may have the same or substantially the same structure. The pads of the pad portion (PP) including the second pad P2 and the third pad P3 may be formed together when a transistor of the display area (DA) to be described is formed.

The second pad P2 and the third pad P3 may be provided on a substrate 110 made of an insulating material such as plastic or glass, and they may respectively have a structure in which three conductive layers, that is, first electrodes 52 and 53, second electrodes 72a and 73a, and third electrodes 72b and 73b overlap each other. However, the pads of the pad portion (PP) such as the second pad P2 and the third pad P3 may include more or less than three conductive layers.

A plurality of insulating layers may be formed on the pad portion (PP), and a buffer layer 120 and a first gate insulating layer 141 may be provided between the substrate 110 and the first electrodes 52 and 53, and a second gate insulating layer 142 and an inter-layer insulating layer 160 may be provided between the first electrodes 52 and 53 and the second electrodes 72a and 73a. A passivation layer 161 and a first planarization layer 180a are provided between the second electrodes 72a and 73a and the third electrodes 72b and 73b, and a second planarization layer 180b is provided on the third electrodes 72b and 73b. The second electrodes 72a and 73a are connected to the first electrodes 52 and 53 through contact holes formed in the second gate insulating layer 142 and the inter-layer insulating layer 160, and the third electrodes 72b and 73b are connected to the second electrodes 72a and 73a through contact holes formed in the passivation layer 161 and the first planarization layer 180a. Portions of the third electrodes 72b and 73b that are not covered by the second planarization layer 180b may be connected through a pad such as a flexible printed circuit film or bumps and conductive balls, or they may be directly connected. The buffer layer 120, the first and second gate insulating layers 141 and 142, the inter-layer insulating layer 160, the passivation layer 161, and the insulating layers of the first and second planarization layers 180a and 180b will be described in more detail when the pixel area is described.

No dummy pad is provided between the second pad P2 and the third pad P3, and the distance d2 between the second pad P2 and the third pad P3 is as wide as if the dummy pad is provided therebetween (e.g., it corresponds to the distance between the first pad P1 and the signal pad to which the test gate signal (T_GATE_G) is input). Therefore, by reducing the intensity of the electric field between the second pad P2 and the third pad P3, the second pad P2 and the third pad P3 may be prevented or substantially prevented from being corroded, and the short path caused by the dummy pad may be prevented or substantially prevented. As described above with reference to FIG. 2, the dummy pad is not provided between the first pad P1 and the second pad P2 and is not provided between the third pad P3 and the fourth pad P4, so the relationship of the second pad P2 and the third pad P3 may be applied as it is.

The exemplary embodiment described with reference to FIG. 2 and FIG. 3 is characterized in that no dummy pad is disposed between the specific signal pads sustaining the voltage difference for a long time, and they are designed as wide as the width of the dummy pad. Exemplary embodiments for disposing such dummy pads and changing the width and the structure thereof to reduce the short circuit defect and the corrosion will now be described while focusing on the differences from the exemplary embodiment described with reference to FIG. 2 and FIG. 3.

Figure 4:
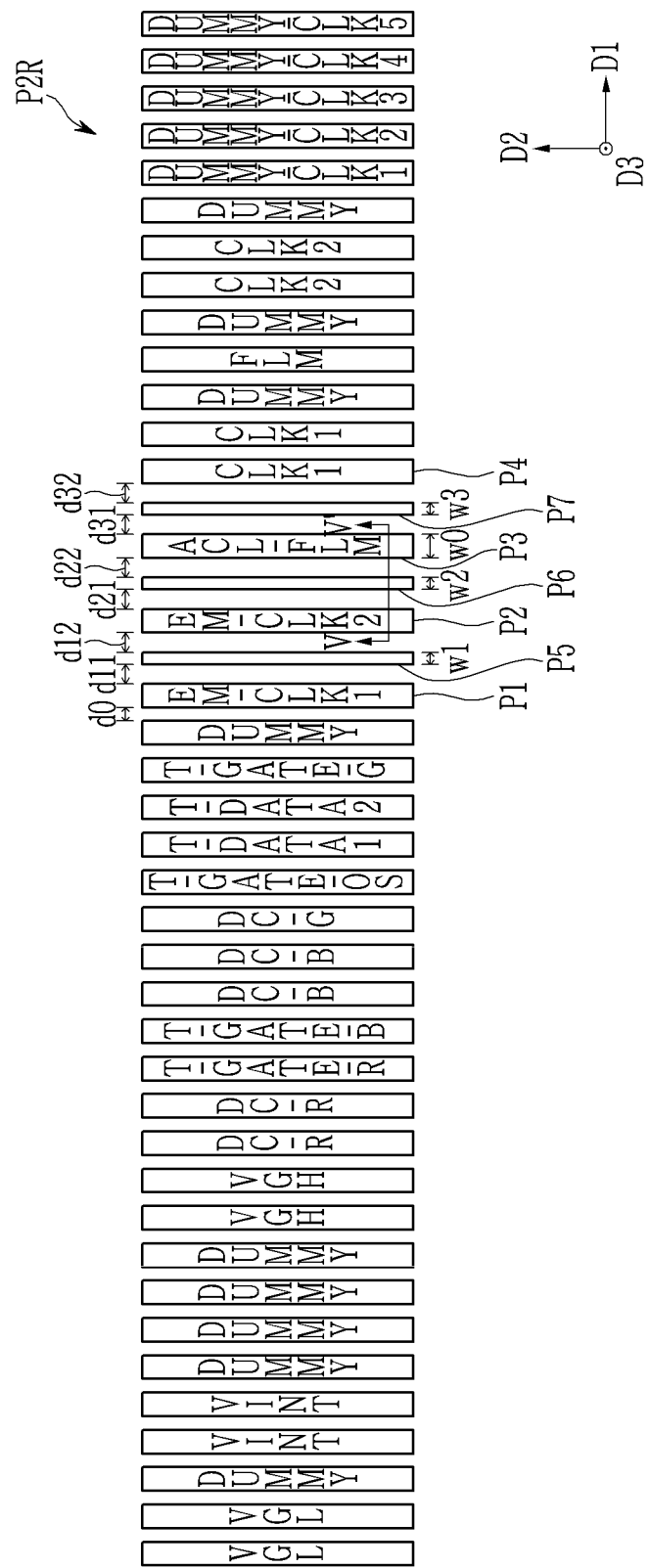
FIG. 4 shows an enlarged view of part of a pad portion of FIG. 1 according to an exemplary embodiment.
Figure 5:
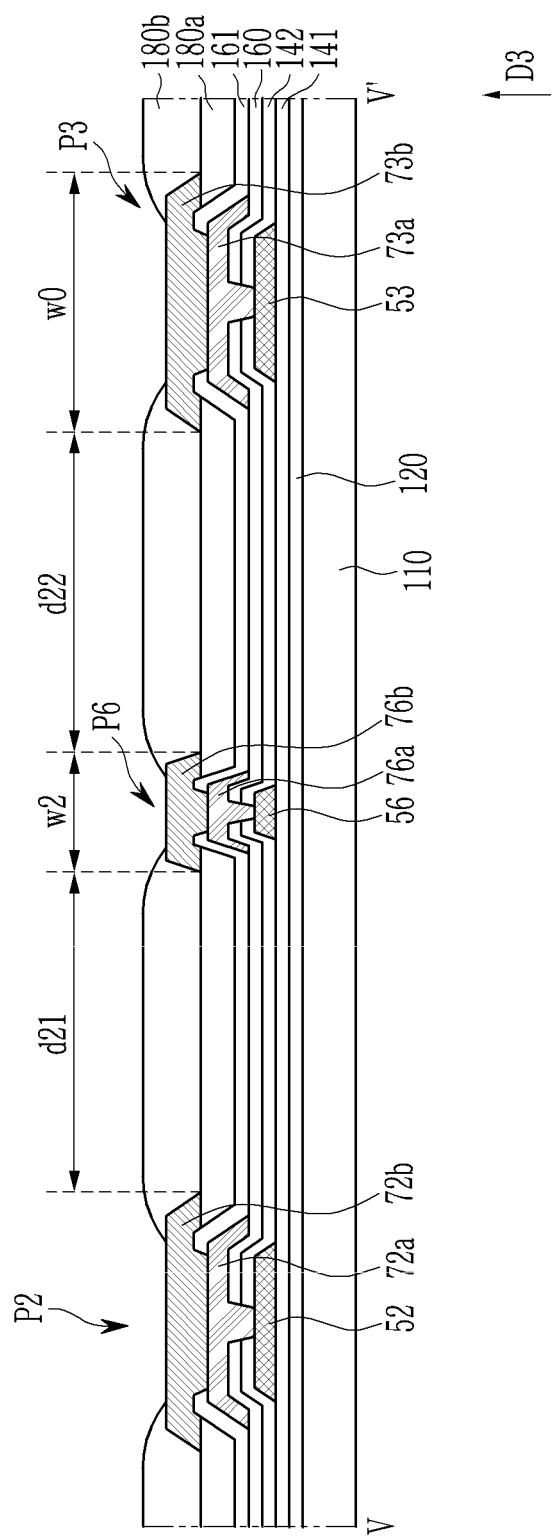
FIG. 5 shows a cross-sectional view taken along the line V-V' of FIG. 4.

FIG. 4 shows an enlarged view of part of a pad portion of FIG. 1 according to an exemplary embodiment, and FIG. 5 shows a cross-sectional view taken along the line V-V' of FIG. 4.

A fifth pad P5, a sixth pad P6, and a seventh pad P7 that are dummy pads are provided between the first pad P1 and the second pad P2, between the second pad P2 and the third pad P3, and between the third pad P3 and the fourth pad P4 sustaining a large voltage difference for a long time. However, a width w1 of the fifth pad P5, a width w2 of the sixth pad P6, and a width w3 of the seventh pad P7 are less than the width w0 of other pads of the second pad group (P2R), and for example, they may be less than about ⅓, about ½, or about ⅕ of the width w0. The width w1 of the fifth pad P5, the width w2 of the sixth pad P6, and the width w3 of the seventh pad P7 may be substantially the same as each other, but they may be different from each other. When the widths w1, w2, and w3 of the fifth, sixth, and seventh pads P5, P6, and P7 are small, the pitches of the adjacent pads may be constant.

When the widths w1, w2, and w3 of the fifth pad P5, the sixth pad P6, and the seventh pad P7 that are dummy pads are reduced, the distance d11 between the first pad P1 and the fifth pad P5, the distance d12 between the fifth pad P5 and the second pad P2, the distance d21 between the second pad P2 and the sixth pad P6, the distance d22 between the sixth pad P6 and the third pad P3, the distance d31 between the third pad P3 and the seventh pad P7, and the distance d32 between the seventh pad P7 and the fourth pad P4 may become greater than the distance d0 between other pads. Therefore, when the metal particles migrate to these dummy pads by the electric field, the possibility of generating a short circuit reduces. Further, when narrow dummy pads are disposed, uniformity of the second pad group (P2R) increases compared to the case in which no dummy pads are disposed, so a bonding characteristic with an electronic component such as a flexible printed circuit film may become better.

Figure 6:
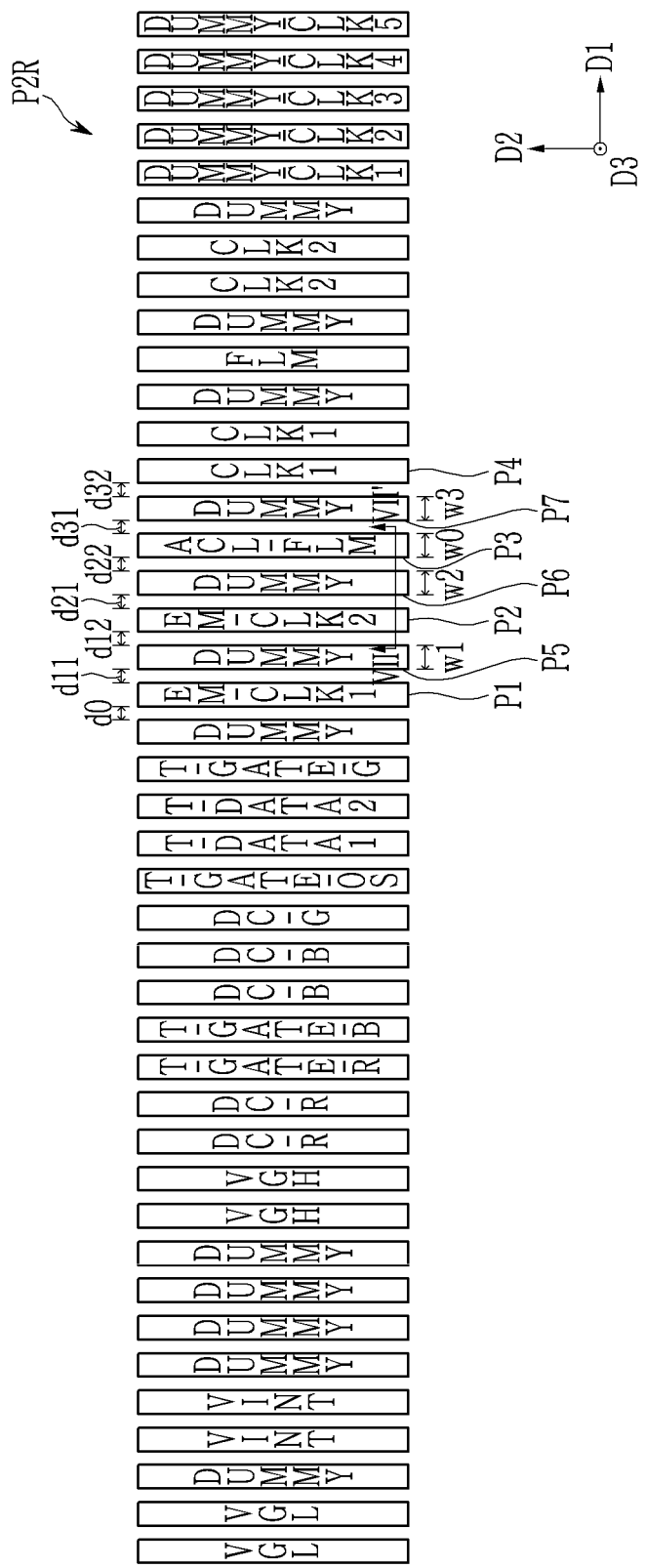
FIG. 6 shows an enlarged view of part of a pad portion of FIG. 1 according to an exemplary embodiment.
Figure 7:
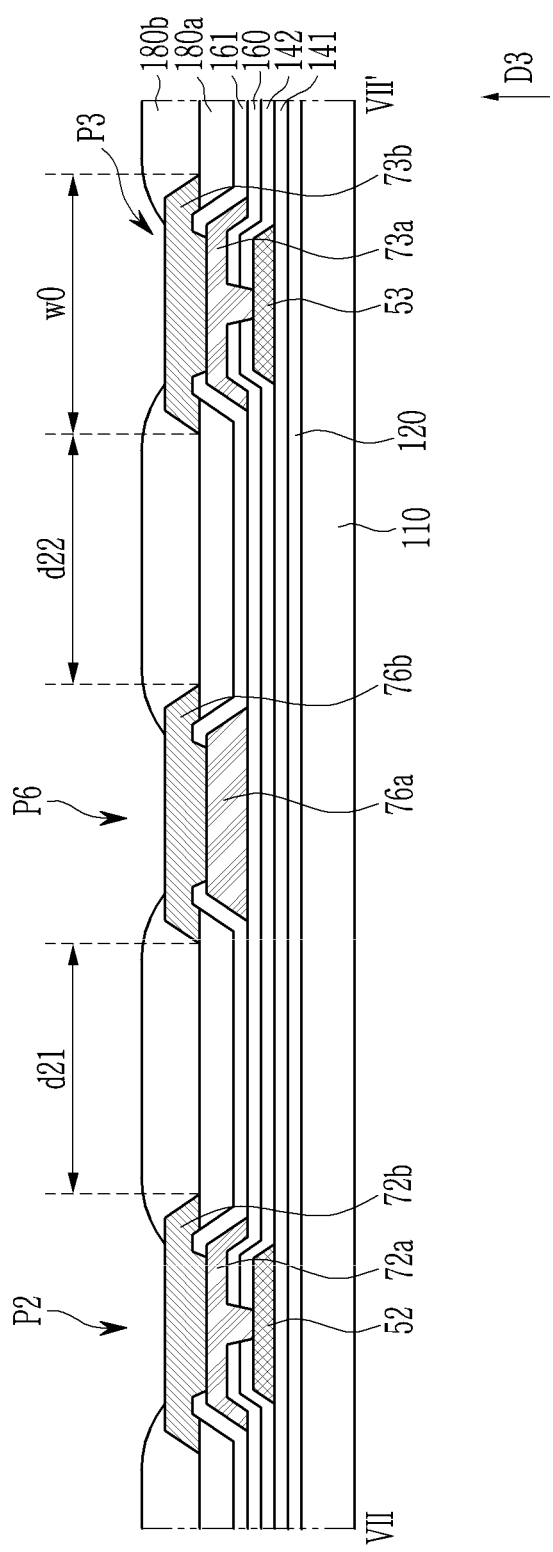
FIG. 7, FIG. 8, and FIG. 9 each show a cross-sectional view taken along the line VII-VII' of FIG. 6 according to a respective exemplary embodiment.
Figure 8:
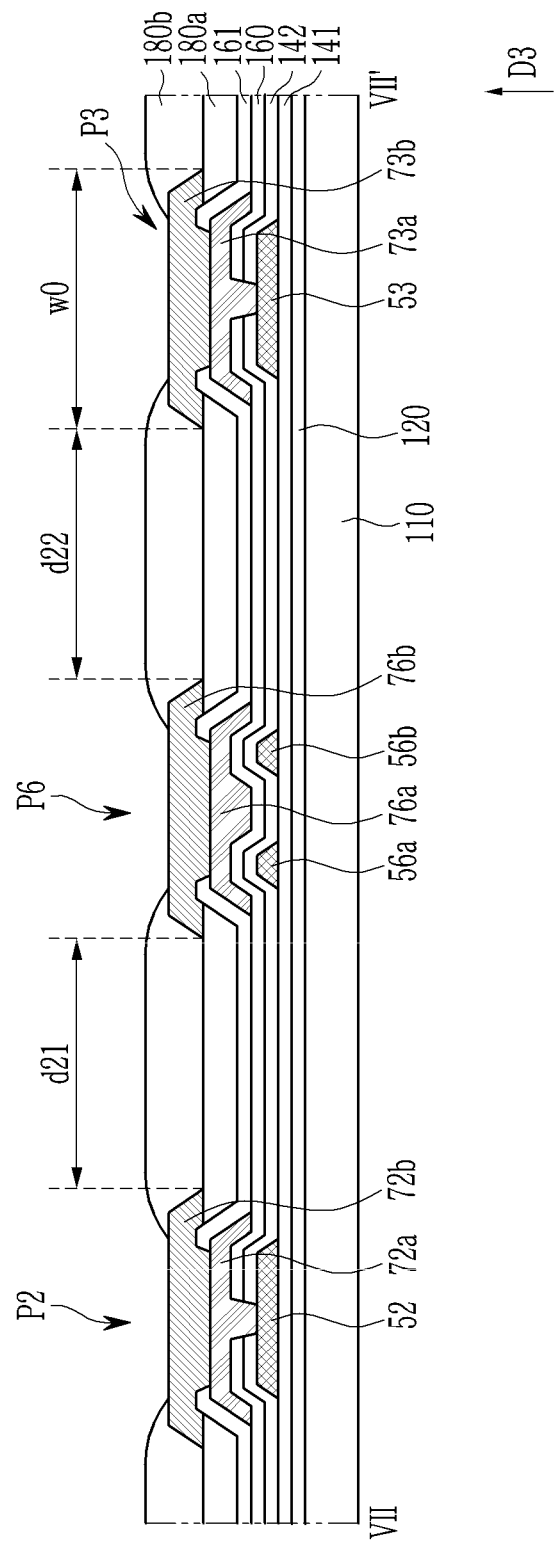
Figure 9:
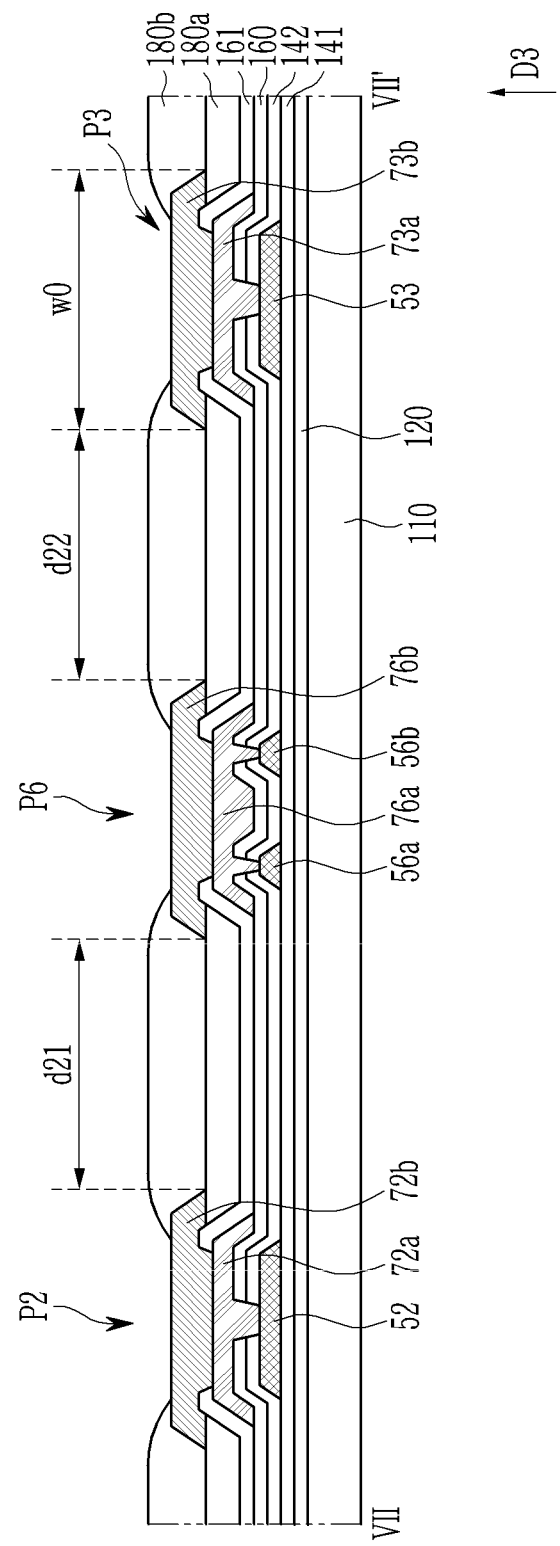

FIG. 6 shows an enlarged view of part of a pad portion of FIG. 1 according to an exemplary embodiment, and FIG. 7, FIG. 8, and FIG. 9 show cross-sectional views taken along the line VII-VII' of FIG. 6 according to an exemplary embodiment.

Referring to FIG. 6, in a like manner of an exemplary embodiment described with reference to FIG. 4 and FIG. 5, a fifth pad P5, a sixth pad P6, and a seventh pad P7 that are dummy pads are provided between the first pad P1 and the second pad P2, between the second pad P2 and the third pad P3, and between the third pad P3 and the fourth pad P4. However, the widths w1, w2, and w3 of the fifth pad P5, the sixth pad P6, and the seventh pad P7 correspond to the width w0 of other pads (w1=w2=w3=w0). When the dummy pads with the same width as other pads are disposed, uniformity of the second pad group (P2R) may further increase, and the bonding characteristic with the flexible printed circuit film may become better. However, in this case, generation of a short circuit may become a problem, so the fifth pad P5, the sixth pad P6, and the seventh pad P7 may not have the same cross-sectional structure as the other pads and may have the same cross-sectional structure as those described with reference to FIG. 7, FIG. 8, and FIG. 9.

Referring to FIG. 7, the second pad P2 and the third pad P3 that are signal pads include three conductive layers including first electrodes 52 and 53, second electrodes 72a and 73a, and third electrodes 72b and 73b, and the sixth pad P6 that is a dummy pad between the second pad P2 and the third pad P3 includes two conductive layers including a second electrode 76a and a third electrode 76b. The first electrodes 52 and 53 may be formed of conductive layers for forming a scan line and a gate electrode of a transistor, and for example, they may be formed of molybdenum (Mo). The molybdenum (Mo) is more susceptible to corrosion than other metals such as aluminum (Al) or copper (Cu). By forming the sixth pad P6 so as not to include such a conductive layer formed of molybdenum (Mo), the sixth pad P6 may be more resistant to corrosion. Although not shown, the fifth pad P5 and the seventh pad P7 may be formed with the same (e.g., substantially the same) structure as the sixth pad P6.

Referring to FIG. 8 and FIG. 9, the sixth pad P6 includes first electrodes 56a and 56b together with a second electrode 76a and a third electrode 76b in a like manner of other pads P2 and P3, and the first electrodes 56a and 56b are divided into two parts. An exemplary embodiment described with reference to FIG. 8 is different from an exemplary embodiment described with reference to FIG. 9 in that the second electrode 76a is not connected to the first electrodes 56a and 56b in the former, while the second electrode 76a is connected to the first electrodes 56a and 56b in the latter.

When other pads include a first electrode while the sixth pad P6 does not include the first electrode, a height (e.g., a distance between an upper side of the substrate 110 and an upper side of the third electrode 76b) of the sixth pad P6 may be lower than heights of other pads. The sixth pad P6 includes the first electrodes 56a and 56b, so uniformity of the second pad group (P2R) may be further increased, which may be desirable in the bonding characteristic. The first electrodes 56a and 56b are divided into two portions, so a size of the first electrodes 56a and 56b may be reduced and an influence caused by corrosion may be reduced. The first electrodes 56a and 56b may be divided into at least three parts. The fifth pad P5 and the seventh pad P7 may be formed to have the same structure as the sixth pad P6.

A display device according to an exemplary embodiment will now be described with a focus on a pixel of the display area (DA) with reference to FIG. 10 to FIG. 12. FIG. 1 will also be referred to in order to describe a relationship with other constituent elements of the display device.

Figure 10:
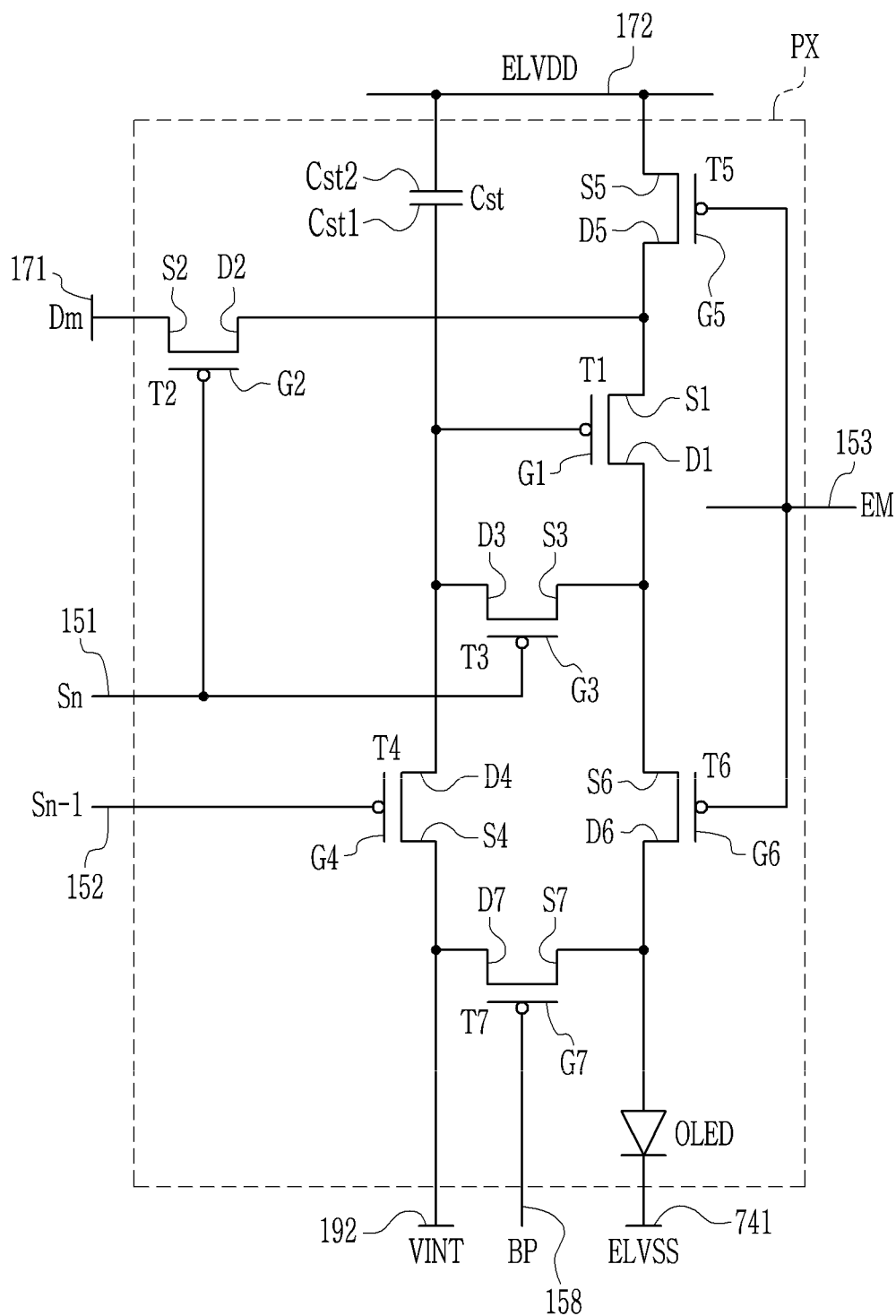
FIG. 10 shows an equivalent circuit diagram of a pixel of a display device according to an exemplary embodiment.
Figure 11:
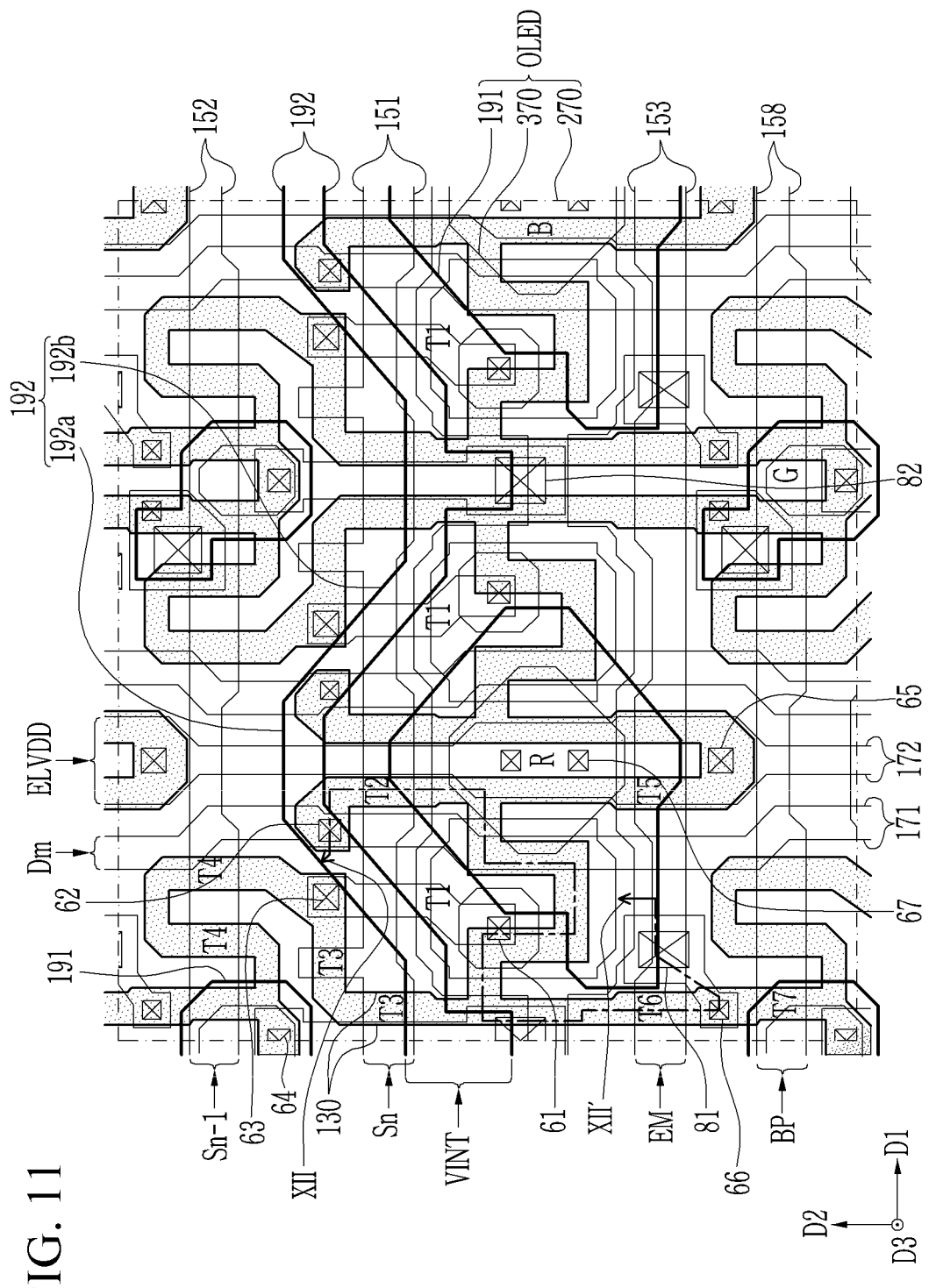
FIG. 11 shows a layout view of pixels of a display device according to an exemplary embodiment.
Figure 12:
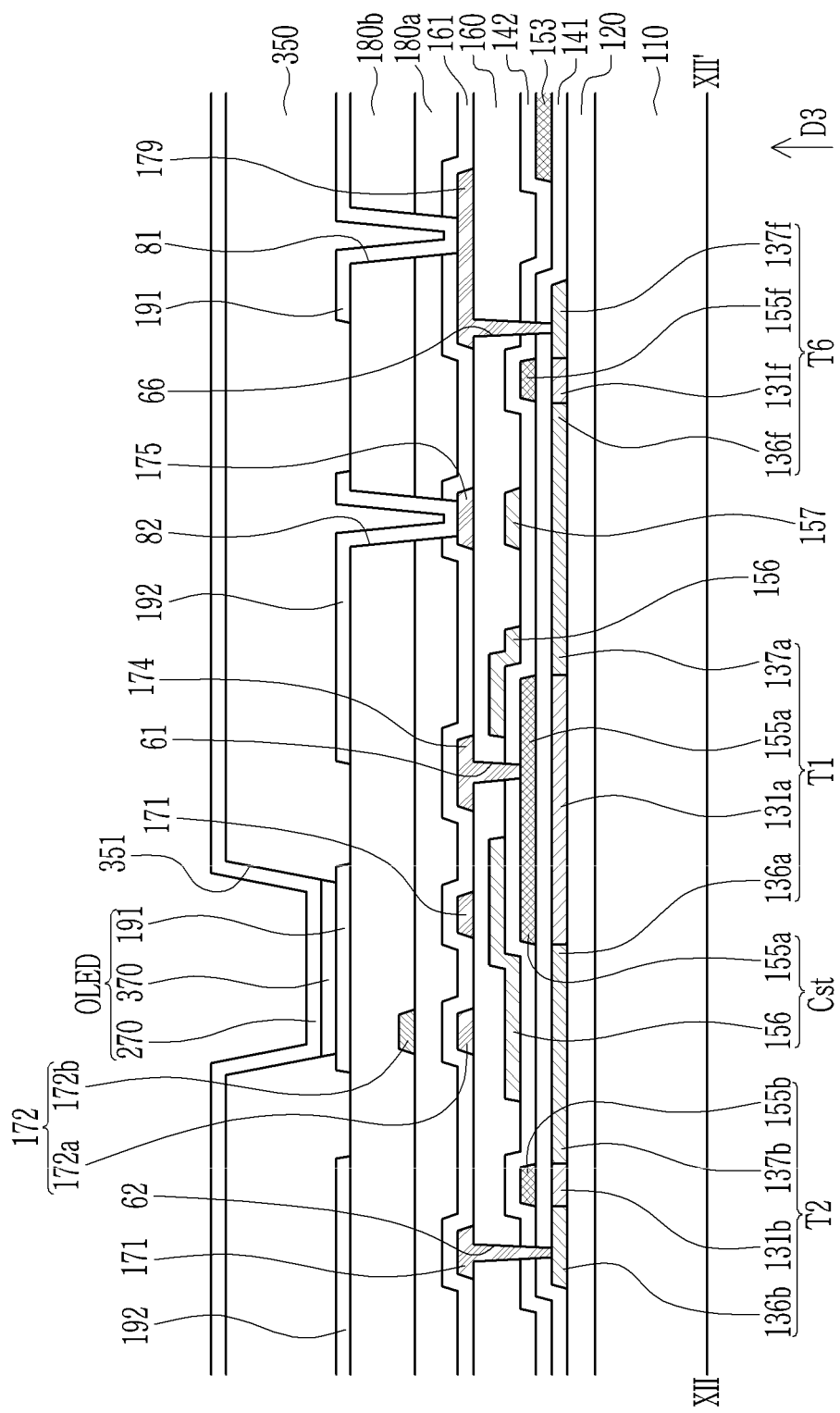
FIG. 12 shows a cross-sectional view taken along the line XII-XII' of FIG. 11.

FIG. 10 shows an equivalent circuit diagram of a pixel of a display device according to an exemplary embodiment, FIG. 11 shows a layout view of pixels of a display device according to an exemplary embodiment, and FIG. 12 shows a cross-sectional view taken along the line XII-XII' of FIG. 11.

Referring to FIG. 10, the pixel PX provided in the display area (DA) in the display device according to an exemplary embodiment includes transistors (T1, T2, T3, T4, T5, T6, and T7) connected to display signal lines (151, 152, 153, 158, 171, 172, and 192), a storage capacitor Cst, and an organic light emitting diode (OLED).

The transistors (T1, T2, T3, T4, T5, T6, and T7) may include a driving transistor T1, a switching transistor T2, a compensation transistor T3, an initialization transistor T4, an operation control transistor T5, an emission control transistor T6, and a bypass transistor T7.

The display signal lines (151, 152, 153, 158, 171, 172, and 192) may include a scan line 151, a previous-stage scan line 152, an emission control line 153, a bypass control line 158, a data line 171, a driving voltage line 172, and an initialization voltage line 192. The scan line 151 and the previous-stage scan line 152 may be connected to a scan signal generating circuit of the above-described scan drivers 410L and 410R to receive a scan signal (Sn) and a previous-stage scan signal Sn−1, and the emission control line 153 may be connected to an emission control signal generating circuit of the above-described emission drivers 420L and 420R to receive an emission control signal (EM).

The previous-stage scan line 152 transmits a previous-stage scan signal Sn−1 to the initialization transistor T4, the emission control line 153 transmits an emission control signal (EM) to the operation control transistor T5 and the emission control transistor T6, and the bypass control line 158 transmits a bypass signal (BP) to the bypass transistor T7.

The data line 171 may receive a data signal (Dm) that may be input through the first pad group (P1C), and the driving voltage line 172 may receive a driving voltage (ELVDD) that may be input through the third pad group (P3R, P3L). The initialization voltage line 192 may receive an initialization voltage (VINT) that may be input through the second pad group (P2R, P2L). The initialization voltage (VINT) initializes the driving transistor T1.

A gate electrode G1 of the driving transistor T1 is connected to a first end Cst1 of the storage capacitor Cst. A source electrode S1 of the driving transistor T1 is connected to a driving voltage line 172 through the operation control transistor T5. A drain electrode D1 of the driving transistor T1 is connected to an anode of the organic light emitting diode (OLED) through the emission control transistor T6.

A gate electrode G2 of the switching transistor T2 is connected to the scan line 151. A source electrode S2 of the switching transistor T2 is connected to the data line 171. A drain electrode D2 of the switching transistor T2 is connected to a source electrode S1 of the driving transistor T1 and is connected to the driving voltage line 172 through the operation control transistor T5.

A gate electrode G3 of the compensation transistor T3 is connected to the scan line 151. A source electrode S3 of the compensation transistor T3 is connected to the drain electrode D1 of the driving transistor T1 and is connected to the anode of the organic light emitting diode (OLED) through the emission control transistor T6. A drain electrode D3 of the compensation transistor T3 is connected to a drain electrode D4 of the initialization transistor T4, a first end Cst1 of the storage capacitor Cst, and a gate electrode G1 of the driving transistor T1.

A gate electrode G4 of the initialization transistor T4 is connected to the previous-stage scan line 152. A source electrode S4 of the initialization transistor T4 is connected to the initialization voltage line 192. A drain electrode D4 of the initialization transistor T4 is connected to a first end Cst1 of the storage capacitor Cst and a gate electrode G1 of the driving transistor T1 through the drain electrode D3 of the compensation transistor T3.

A gate electrode G5 of the operation control transistor T5 is connected to the emission control line 153. A source electrode S5 of the operation control transistor T5 is connected to the driving voltage line 172. A drain electrode D5 of the operation control transistor T5 is connected to the source electrode S1 of the driving transistor T1 and the drain electrode D2 of the switching transistor T2.

A gate electrode G6 of the emission control transistor T6 is connected to the emission control line 153. A source electrode S6 of the emission control transistor T6 is connected to the drain electrode D1 of the driving transistor T1 and the source electrode S3 of the compensation transistor T3. A drain electrode D6 of the emission control transistor T6 is connected to the anode of the organic light emitting diode (OLED).

A gate electrode G7 of the bypass transistor T7 is connected to the bypass control line 158. A source electrode S7 of the bypass transistor T7 is connected to the drain electrode D6 of the emission control transistor T6 and the anode of the organic light emitting diode (OLED). The drain electrode D7 of the bypass transistor T7 is connected to the initialization voltage line 192 and the source electrode S4 of the initialization transistor T4.

A second end Cst2 of the storage capacitor Cst is connected to the driving voltage line 172. A cathode of the organic light emitting diode (OLED) is connected to a common voltage line 741 for transmitting a common voltage (ELVSS). The common voltage line 741 or the cathode receives the common voltage (ELVSS) that may be input through the third pad group (P3L, P3R).

A circuit configuration of the pixel PX is not limited to that shown in FIG. 10, and the number of transistors, the number of capacitors, and the connections therebetween are modifiable in various suitable ways.

Referring to FIG. 11, for example, a pixel area including a red pixel (R), a green pixel (G), and a blue pixel (B) is shown. The pixels R, G, and B may be arranged as a matrix on the display panel 100.

The scan line 151 for transmitting a scan signal (Sn), the previous-stage scan line 152 for transmitting a previous-stage scan signal Sn–1, the emission control line 153 for transmitting an emission control signal (EM), and the bypass control line 158 for transmitting a bypass signal (BP) substantially extend in the first direction D1. The bypass control line 158 may correspond to the previous-stage scan line 152. The data line 171 for transmitting a data signal (Dm) and the driving voltage line 172 for transmitting a driving voltage (ELVDD) substantially extend in the second direction D2. The initialization voltage line 192 for transmitting an initialization voltage (VINT) includes a horizontal portion 192a substantially in parallel with the first direction D1 and an oblique portion 192b inclined from the horizontal portion 192a.

The driving transistor T1, the switching transistor T2, the compensation transistor T3, the initialization transistor T4, the operation control transistor T5, the emission control transistor T6, the bypass transistor T7, the storage capacitor Cst, and the organic light emitting diode (OLED) may be formed at positions shown (e.g., designated) in FIG. 11.

The organic light emitting diode (OLED) includes a pixel electrode 191, an organic emission layer 370, and a common electrode 270. The compensation transistor T3 and the initialization transistor T4 may have a dual gate structure so as to intercept a leakage current.

Respective channels of the driving transistor T1, the switching transistor T2, the compensation transistor T3, the initialization transistor T4, the operation control transistor T5, the emission control transistor T6, and the bypass transistor T7 are provided on a semiconductor (e.g., a semiconductor layer) 130. The semiconductor 130 may be curved and formed in various shapes.

A cross-sectional structure of the display area (DA), including (e.g., regarding) several transistors and a storage capacitor, will now be described with reference to FIG. 11 and FIG. 12. FIG. 3 will also be referred to in comparison of the cross-sectional structure of (e.g., regarding) the pad portion (PP).

The display device includes a substrate 110 and layers formed thereon. The substrate 110 may be a flexible substrate made of a polymer film. For example, the substrate 110 may be made of a plastic such as polyimide, polyamide, polyethylene terephthalate, or polycarbonate.

A buffer layer 120 is provided on the substrate 110. The buffer layer 120 may intercept an impurity that may migrate (e.g., spread) to the semiconductor 130 from the substrate 110, and may reduce the stress applied to the substrate 110 during a process for forming a semiconductor layer. The buffer layer 120 may increase adhesion of the semiconductor 130 (e.g., to the substrate 110). The buffer layer 120 is an insulating layer, but it is called a buffer layer in consideration of its function. The buffer layer 120 may include an inorganic insulating material such as silicon oxide (SiOx) or silicon nitride (SiNx).

The semiconductor 130 including a driving channel 131a, a switching channel 131b, and an emission control channel 131f is provided on the buffer layer 120. The semiconductor 130 may include polysilicon, an oxide semiconductor, or amorphous silicon.

Regarding the semiconductor 130, a driving source electrode 136a and a driving drain electrode 137a are provided on respective sides of the driving channel 131a, and a switching source electrode 136b and a switching drain electrode 137b are provided on respective sides of the switching channel 131b. Further, an emission control source electrode 136f and an emission control drain electrode 137f are provided on respective sides of the emission control channel 131f.

A first gate insulating layer 141 is provided on the semiconductor 130. A scan line 151 including a switching gate electrode 155b, a previous-stage scan line 152, an emission control line 153 including an emission control gate electrode 155f, a bypass control line 158, and a first gate conductor including a driving gate electrode (first storage electrode) 155a are provided on the first gate insulating layer 141. The first gate conductor may be formed by patterning one or more conductive layers together. The first gate conductor may include first electrodes 52 and 53 of the second and third pads P2 and P3.

A second gate insulating layer 142 is provided on the first gate conductor and the first gate insulating layer 141. A second gate conductor including a storage line 157 and a second storage electrode 156 that is an extension from the storage line 157 is provided on the second gate insulating layer 142. The second storage electrode 156 forms a storage capacitor Cst together with the first storage electrode 155a. The first and second gate conductors may include a metal such as molybdenum (Mo), copper (Cu), aluminum (Al), silver (Ag), chromium (Cr), tantalum (Ta), or titanium (Ti), or a metal alloy thereof. The first and second gate insulating layers 141 and 142 may include an inorganic insulating material such as silicon oxide or silicon nitride.

An inter-layer insulating layer 160 is provided on the second gate insulating layer 142 and the second gate conductor. The inter-layer insulating layer 160 may include an inorganic insulating material and/or an organic insulating material.

Contact holes (61, 62, 63, 64, 65, 66, and 67) are formed in the inter-layer insulating layer 160. A first data conductor including a data line 171, a first voltage line 172a of the driving voltage line 172, a driving connecting member 174, an initialization connecting member 175, and a pixel connecting member 179 is provided on the inter-layer insulating layer 160. The first data conductor may include second electrodes 72a and 73a of the second and third pads P2 and P3. The data line 171 is connected to a switching source electrode 136b through the contact hole 62 formed in the insulating layers 141, 142, and 160. The driving connecting member 174 includes a first end connected to the first storage electrode 155a through the contact hole 61 formed in the insulating layers 142 and 160, and a second end connected to a compensation drain electrode and an initialization drain electrode through the contact hole 63 formed in the insulating layers 141, 142, and 160. The initialization connecting member 175 is connected to an initialization source electrode through the contact hole 64 formed in the insulating layers 141, 142, and 160. The pixel connecting member 179 is connected to the emission control drain electrode 137f through the contact hole 66 formed in the insulating layers 141, 142, and 160.

The passivation layer 161 is provided on the first data conductor and the inter-layer insulating layer 160, and the first planarization layer 180a is provided on the passivation layer 161. A second data conductor including a second voltage line 172b of the driving voltage line 172 is provided on the first planarization layer 180a. The second data conductor may include third electrodes 72b and 73b of the second and third pads P2 and P3. When the driving voltage line 172 is formed with a first conductor and a second conductor that are two voltage lines 172a and 172b, resistance of the driving voltage line 172 reduces so that a load effect may be reduced and a phenomenon of generation of a luminance difference in the display area (DA) may be prevented (or substantially prevented). The second data conductor may include third electrodes 72b and 73b of the second and third pads P2 and P3. The first and second data conductors may, for example, include metals such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A second planarization layer 180b is provided on the second conductor and first planarization layer 180a. The first and second planarization layers 180a and 180b may include an organic material.

A pixel electrode 191 and an initialization voltage line 192 are provided on the second planarization layer 180b. The pixel connecting member 179 is connected to the pixel electrode 191 through a contact hole 81 formed in the planarization layers 180a and 180b, and the initialization connecting member 175 is connected to the initialization voltage line 192 through a contact hole 82 formed in the planarization layers 180a and 180b.

A pixel definition layer 350 is provided on edges of the second planarization layer 180b, the initialization voltage line 192, and the pixel electrode 191. The pixel definition layer 350 includes an opening 351 overlapping the pixel electrode 191. The pixel definition layer 350 may include an organic material such as a polyacrylate resin or a polyimide resin.

An organic emission layer 370 is provided on the pixel electrode 191, and a common electrode 270 is provided on the organic emission layer 370. The common electrode 270 may be provided on the pixel definition layer 350 so it may be formed through (e.g., on) a plurality of pixels. The pixel electrode 191, the organic emission layer 370, and the common electrode 270 form an organic light emitting diode (OLED).

An encapsulation layer for protecting the organic light emitting diode (OLED) may be provided on the common electrode 270, and a polarization layer for reducing reflection of external light may be provided on the encapsulation layer.

Figure 13:
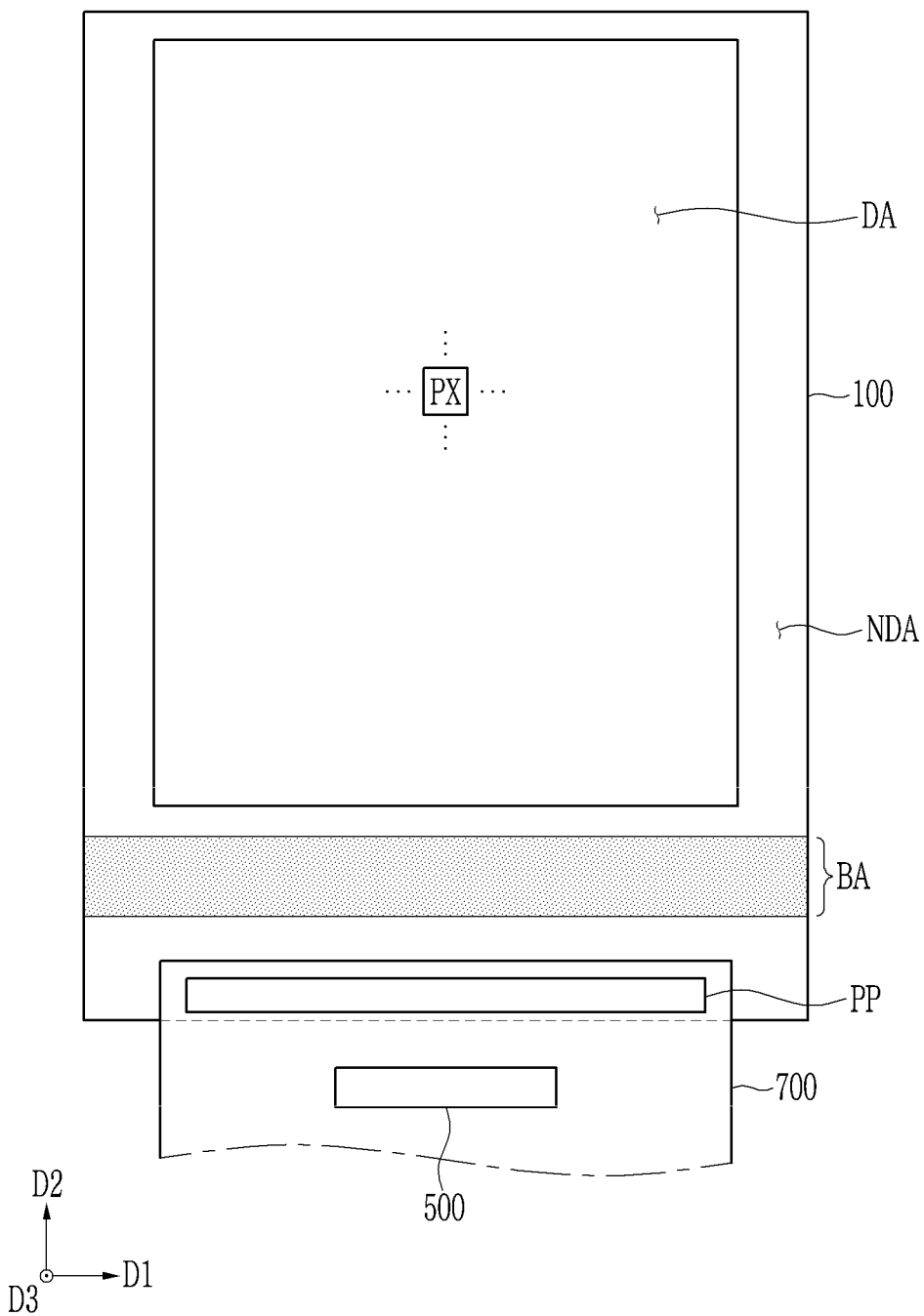
FIG. 13 shows a layout view of a display device before a display panel included in the display device according to an exemplary embodiment is bent.
Figure 14:
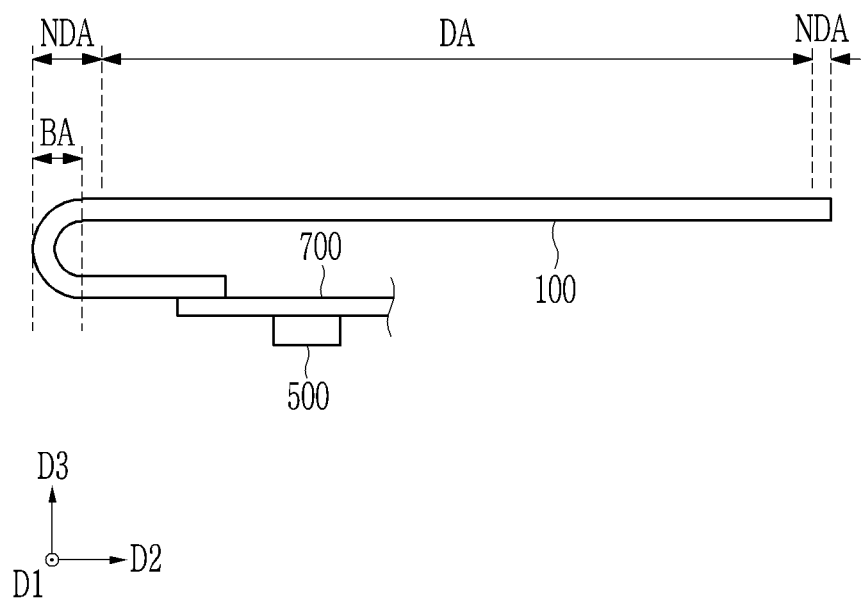
FIG. 14 shows a lateral view of the display device after the display panel shown in FIG. 13 is bent.

FIG. 13 shows a layout view of a display device before a display panel included in a display device according to an exemplary embodiment is bent, and FIG. 14 shows a lateral view of the display device after the display panel shown in FIG. 13 is bent.

Referring to FIG. 13, a flexible printed circuit film 700 is bonded to a pad portion (PP) of the display panel 100 described with reference to FIG. 1. A driving circuit chip 500 is mounted on one side of the flexible printed circuit film 700. Various signals are input to the display panel 100 from the flexible printed circuit film 700 through the pad portion (PP). Differing from the shown exemplary embodiment, the driving circuit chip 500 may be provided between the bending area (BA) and the pad portion (PP) in the non-display area (NDA).

Referring to FIG. 14, the display panel 100 is bent with a set or predetermined curvature in the bending area (BA). When the display panel 100 is bent as described, the width of the non-display area (NDA) may be reduced when seen from the front (in a third direction D3), so the width of a bezel covering the non-display area (NDA) of the display panel 100 may be reduced in a device (e.g., a smartphone) to which the display panel 100 is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device comprising:
    a display panel comprising a display area and a non-display area adjacent to the display area;
    a gate driver in the non-display area; and
    an emission driver in the non-display area,
    wherein the display panel comprises a pad portion to which signals are input,
    the pad portion comprises a pad group to which signals transmitted to the gate driver and the emission driver are input, the pad group comprising an emission frame signal input pad, a pad adjacent to the emission frame signal input pad, a scan frame signal input pad and a pad adjacent to the scan frame signal input pad, and a distance between the emission frame signal input pad and the pad adjacent to the emission frame signal input pad is greater than a distance between the scan frame signal input pad and the pad adjacent to the scan frame signal input pad.

2. The display device of claim 1, wherein
a first emission clock signal or a clock signal is input to the pad adjacent to the emission frame signal input pad.

3. The display device of claim 2, wherein
the pad adjacent to the emission frame signal input pad comprises a first emission clock signal input pad and a clock signal input pad, the emission frame signal input pad being between the first emission clock signal input pad and the clock signal input pad, and
the first emission clock signal is input to the first emission clock signal input pad, and the clock signal is input to the clock signal input pad.

4. The display device of claim 1, wherein
the pad adjacent to the scan frame signal input pad is a dummy pad.

5. The display device of claim 3, wherein
the pad group further comprises a second emission clock signal input pad adjacent to the first emission clock signal input pad, the first emission clock signal input pad being between the second emission clock signal input pad and the emission frame signal input pad, and
a distance between the first emission clock signal input pad and the second emission clock signal input pad is greater than the distance between the scan frame signal input pad and the pad adjacent to the scan frame signal input pad.

6. The display device of claim 5, wherein
a second emission clock signal with a phase that is opposite to a phase of the first emission clock signal is input to the second emission clock signal input pad.

7. The display device of claim 1, wherein
the pad adjacent to the emission frame signal input pad comprises a first pad adjacent to the emission frame signal input pad and a second pad adjacent to the emission frame signal input pad, the emission frame signal input pad being between the first pad and the second pad, and
a distance between the emission frame signal input pad and the first pad corresponds to a summation of twice the distance between the scan frame signal input pad and the pad adjacent to the scan frame signal input pad and a width of the emission frame signal input pad.

8. The display device of claim 7, wherein
a distance between the emission frame signal input pad and the second pad corresponds to a summation of twice the distance between the scan frame signal input pad and the pad adjacent to the scan frame signal input pad and a width of the emission frame signal input pad.

9. The display device of claim 6, wherein
a distance between the second emission clock signal input pad and the first emission clock signal input pad corresponds to a summation of twice the distance between the scan frame signal input pad and the pad adjacent to the scan frame signal input pad and a width of the emission frame signal input pad.

10. The display device of claim 1, wherein
a width of the scan frame signal input pad corresponds to a width of the emission frame signal input pad.

11. A display device comprising:
a display panel comprising a display area and a non-display area adjacent to the display area;
a gate driver in the non-display area; and
an emission driver in the non-display area,
wherein the display panel comprises a pad portion to which signals are input,
the pad portion comprises a pad group to which signals transmitted to the gate driver and the emission driver are input, the pad group comprising an emission frame signal input pad and a pad adjacent to the emission frame signal input pad, and
a width of the pad adjacent to the emission frame signal input pad is less than a width of the emission frame signal input pad.

12. The display device of claim 11, wherein
the pad adjacent to the emission frame signal input pad is a dummy pad.

13. The display device of claim 12, wherein
the pad adjacent to the emission frame signal input pad comprises a first pad adjacent to the emission frame signal input pad and a second pad adjacent to the emission frame signal input pad, the emission frame signal input pad being between the first pad and the second pad, and
a width of the first pad and a width of the second pad are each less than a width of the emission frame signal input pad.

14. The display device of claim 13, wherein
the first pad and the second pad are dummy pads.

15. The display device of claim 14, wherein
the pad group further comprises a first emission clock signal input pad adjacent to the first pad and a clock signal input pad adjacent to the second pad, the first pad being between the first emission clock signal input pad and the emission frame signal input pad, and the second pad being between the clock signal input pad and the emission frame signal input pad, and
an emission clock signal is input to the first emission clock signal input pad, and
a clock signal is input to the clock signal input pad.

16. The display device of claim 15, wherein
the pad group further comprises a third pad adjacent to the first emission clock signal input pad, the first emission clock signal input pad being between the third pad and the first pad, and
a width of the third pad is less than a width of the emission frame signal input pad.

17. The display device of claim 16, wherein
the third pad is a dummy pad.

18. The display device of claim 17, wherein
the pad group further comprises a second emission clock signal input pad adjacent to the third pad, the third pad being between the second emission clock signal input pad and the first emission clock signal input pad, and
a second emission clock signal with a phase that is opposite to a phase of the first emission clock signal is input to the second emission clock signal input pad.

19. The display device of claim 14, wherein
the pad group further comprises a clock signal input pad adjacent to the second pad, the second pad being between the clock signal input pad and the emission frame signal input pad, and
a clock signal is input to the clock signal input pad.

20. The display device of claim 11, wherein
the pad group further comprises a scan frame signal input pad and a pad adjacent to the scan frame signal input pad, and
a distance between the emission frame signal input pad and the pad adjacent to the emission frame signal input pad is greater than a distance between the scan frame signal input pad and the pad adjacent to the scan frame signal input pad.

* * * * *